United States Patent
Yu et al.

(10) Patent No.: US 12,108,593 B2
(45) Date of Patent: Oct. 1, 2024

(54) METHOD FOR PREPARING SEMICONDUCTOR STRUCTURE USING A FIRST MASK COMPRISES A GROOVE

(71) Applicant: CHANGXIN MEMORY TECHNOLOGIES, INC., Hefei (CN)

(72) Inventors: Yexiao Yu, Hefei (CN); Longyang Chen, Hefei (CN); Zhongming Liu, Hefei (CN); Zhong Kong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 289 days.

(21) Appl. No.: 17/807,837

(22) Filed: Jun. 20, 2022

(65) Prior Publication Data

US 2023/0180464 A1 Jun. 8, 2023

Related U.S. Application Data

(63) Continuation of application No. PCT/CN2022/070829, filed on Jan. 7, 2022.

(30) Foreign Application Priority Data

Dec. 6, 2021 (CN) .......................... 202111478194.2

(51) Int. Cl.
*H10B 12/00* (2023.01)

(52) U.S. Cl.
CPC .................................. *H10B 12/482* (2023.02)

(58) Field of Classification Search
CPC ................ H10B 12/482; H10B 12/485; H01L 21/31144

USPC ......................................................... 438/262
See application file for complete search history.

(56) References Cited

U.S. PATENT DOCUMENTS

| 6,764,939 | B1 * | 7/2004 | Yoshitaka ......... H01L 21/31144 |
| | | | 257/E21.264 |
| 8,614,143 | B2 | 12/2013 | Kulkarni |
| 8,865,547 | B2 | 10/2014 | Kang |
| 2010/0136781 | A1 | 6/2010 | Kulkarni |
| 2010/0164114 | A1 | 7/2010 | Kang |
| 2013/0196477 | A1 | 8/2013 | Kang |
| 2015/0004774 | A1 | 1/2015 | Kang |

FOREIGN PATENT DOCUMENTS

| CN | 102637646 A | 8/2012 |
| CN | 110233152 A | 9/2019 |
| CN | 210272309 U | 4/2020 |
| CN | 113078105 A | 7/2021 |

* cited by examiner

*Primary Examiner* — Hoai V Pham
(74) *Attorney, Agent, or Firm* — Syncoda LLC; Feng Ma

(57) ABSTRACT

A method includes the following operations for preparing a semiconductor structure, a semiconductor, and a semiconductor memory. A first dielectric layer and a first barrier layer are deposited on a substrate including an active area in sequence. A first mask including a first etching pattern is formed on the first barrier layer, and includes a groove extending in a first direction and uniformly distributed etching holes. Herein, the groove penetrates through the etching hole, and the depth of the etching hole is larger than that of the groove. Etching is performed along the first etching pattern, to remove the first barrier layer and etch the first dielectric layer to form a conductive channel.

12 Claims, 45 Drawing Sheets

METHOD FOR PREPARING SEMICONDUCTOR STRUCTURE USING A FIRST MASK COMPRISES A GROOVE

CROSS-REFERENCE TO RELATED APPLICATION

This is a continuation of International Application No. PCT/CN2022/070829 filed on Jan. 7, 2022, which claims priority to Chinese Patent Application No. 202111478194.2 filed on Dec. 6, 2021. The disclosures of the above applications are hereby incorporated by reference in their entirety.

TECHNICAL FIELD

The disclosure relates to the field of semiconductor technology, and in particular to a method for preparing a semiconductor structure, a semiconductor structure, and a semiconductor memory.

BACKGROUND

With the continuous development of semiconductor technology, an integrated circuit continuously pursues high speed, high integration density and low power consumption. Therefore, the structure size of a semiconductor device in the integrated circuit is also continuously miniaturized.

Existing semiconductor structures are more and more difficult to meet the needs of development. There is a need to constantly innovate to the semiconductor structure, and to design more novel semiconductor structures.

SUMMARY

Embodiments of the disclosure are expected to provide a method for preparing a semiconductor structure, a semiconductor structure, and a semiconductor memory, which may form a novel conductive channel structure with less times of photomasking.

The technical solutions of the disclosure are implemented as follows.

The embodiments of the disclosure provide a method for preparing a semiconductor structure, which includes the following operations.

A substrate including an active area is provided.

A first dielectric layer and a first barrier layer are deposited on the substrate in sequence.

A first mask including a first etching pattern is formed on the first barrier layer. The first etching pattern includes a groove extending in a first direction and uniformly distributed etching holes. The groove penetrates through the etching holes, and the depth of the etching hole is larger than that of the groove.

Etching is performed along the first etching pattern to remove the first barrier layer and etch the first dielectric layer to form a conductive channel.

The embodiments of the disclosure further provide a semiconductor structure, which is prepared by the preparation method in the above solution.

The embodiments of the disclosure further provide a semiconductor memory, which includes the semiconductor structure in the above solution.

DETAILED DESCRIPTION

For making the objectives, technical solutions, and advantages of the present disclosure clearer, the technical solutions of the disclosure will further be described below in combination with the drawings and the embodiments in detail. The described embodiments should not be considered as limitation to the disclosure. All other embodiments obtained by those ordinary skilled in the art without creative work shall fall within the scope of protection of the disclosure.

"Some embodiments" involved in the following descriptions describes a subset of all possible embodiments. However, it can be understood that "some embodiments" may be the same subset or different subsets of all the possible embodiments, and may be combined without conflicts.

If the similar descriptions of "first/second" present in the application documents, the following descriptions should be understood. Terms "first/second/third" involved in the following descriptions are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

A Dynamic Random Access Memory (DRAM) is a semiconductor element commonly used in electronic devices such as computers, and is composed of a plurality of storage units. Each storage unit generally includes a capacitor and a transistor. A gate of the transistor is electrically connected with a word line, a source is electrically connected with a bit line, and a drain is electrically connected with the capacitor. The on and off of the transistor can be controlled by a voltage of the word line, so as to read data information stored in the capacitor through the bit line or write data information in the capacitor.

The development of the DRAM pursues performance indicators such as high speed, high integration density, and low power consumption. With the miniaturization of the structure size of a semiconductor device, the technical barriers encountered by the existing structure are increasingly apparent, especially in the process of manufacturing the DRAM with critical size less than 15 nm. Therefore, developing more novel structures on the basis of the existing structure is a favorable means to break the existing technical barriers.

Figure 1:
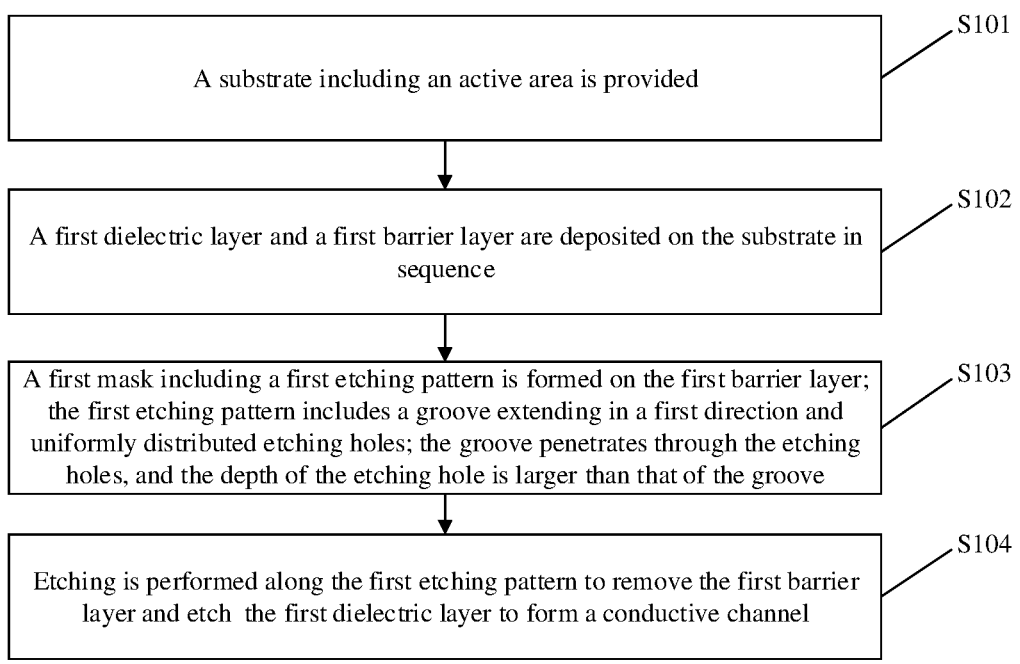
FIG. 1 shows Flowchart I of a method for preparing a semiconductor structure according to an embodiment of the disclosure.

FIG. 1 shows an optional flowchart of a method for preparing a semiconductor structure according to an embodiment of the disclosure, which will be described with reference to the steps shown in FIG. 1.

At S101, a substrate including an active area is provided.

Figure 2:
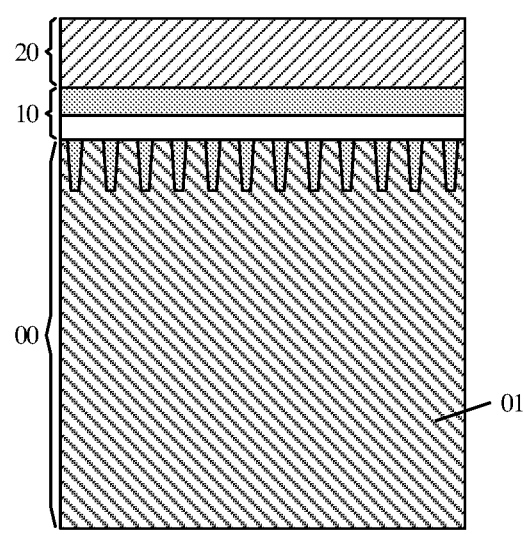
FIG. 2 schematically shows Diagram I of a method for preparing a semiconductor structure according to an embodiment of the disclosure.

In the embodiment of the disclosure, FIG. 2 is a front sectional view. As shown in FIG. 2, the substrate 00 includes the active area 01. The material of the active area 01 may be doped silicon (Si). By a semiconductor apparatus, the substrate 00 may be doped to construct the active area 01 therein.

It is to be noted that the substrate is a clean single crystal sheet configured to process a semiconductor and has a specific crystal plane and appropriate electrical, optical, and mechanical properties. The semiconductor structure is formed by processing on the substrate. The material of the substrate may be single crystal silicon or other single crystal compound semiconductors.

At S102, a first dielectric layer and a first barrier layer are deposited on the substrate in sequence.

In the embodiment of the disclosure, continuing to refer to FIG. 2, the first dielectric layer 10 and the first barrier layer 20 may be deposited by a semiconductor apparatus on the substrate 00 in sequence.

It is to be noted that the barrier layer is configured to form a downward transfer pattern as required and protect areas that do not need be etched during etching.

In the embodiment of the disclosure, the material of the first dielectric layer 10 may include silicon nitride (SiN) and silicon oxide (SiO), and the silicon nitride layer covers the silicon oxide layer. The material of the first barrier layer 20 may be Spin-on Hardmasks (SOH).

At S103, a first mask including a first etching pattern is formed on the first barrier layer. The first etching pattern includes a groove extending in a first direction and uniformly distributed etching holes. The groove penetrates through the etching holes, and the depth of the etching hole is larger than that of the groove.

Figure 3A:
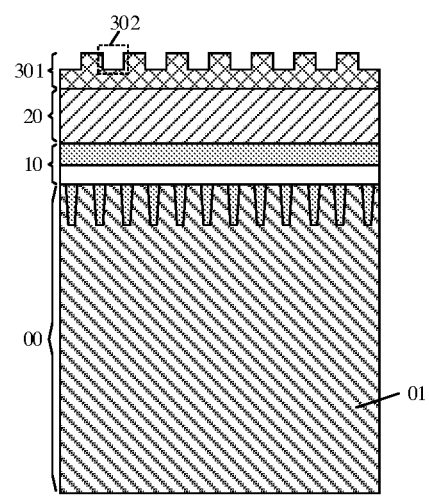
FIG. 3A schematically shows Diagram II of a method for preparing a semiconductor structure according to an embodiment of the disclosure.
Figure 3B:
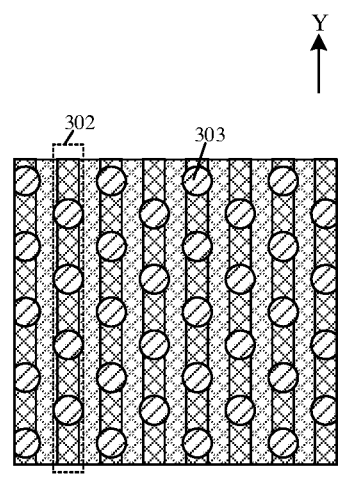
FIG. 3B schematically shows Diagram III of a method for preparing a semiconductor structure according to an embodiment of the disclosure.

In the embodiment of the disclosure, FIG. 3A and FIG. 3B are a front sectional view and a top view respectively. As shown in FIG. 3A and FIG. 3B, the first mask 301 including the first etching pattern may be formed on the first barrier layer 20 by a semiconductor apparatus. The first etching pattern includes the groove 302 extending in the first direction and the uniformly distributed etching holes 303.

In the embodiment of the disclosure, the groove 302 penetrates through the etching holes 303. The depth of the etching hole 303 is larger than that of the groove 302. For example, the first barrier layer 20 may be exposed at the position of the etching hole 303, but the first barrier layer 20 may be not exposed at the position of the groove 302.

Figure 4:
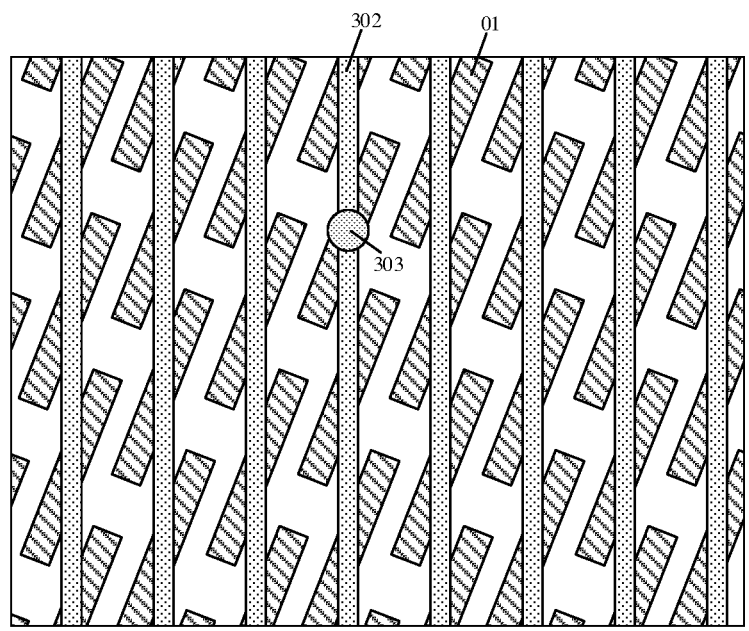
FIG. 4 schematically shows Diagram IV of a method for preparing a semiconductor structure according to an embodiment of the disclosure.

In the embodiment of the disclosure, the etching hole 303 is in a shape of circular. The diameter of each etching hole 303 is larger than the width of the groove 302 extending in the first direction Y, and the projection of each etching hole 303 covers at most one active area 01. As shown in FIG. 4, in the DRAM, the active area 01 is characterized as a strip-shaped structure arranged in an array, which intersects the projection of the groove 302 at a certain angle. The depth of the etching hole 303 is larger than the depth of the groove 302, so that the active area 01 may be exposed at the projection position of the etching hole 303, thereby forming a contact point with the active area 01. The diameter of each etching hole 303 is larger than the width of the groove 302, and thus a larger contact point may be formed with the active area 01. Meanwhile, the projection of each etching hole 303 only covers at most one active area 01, so as to avoid a short circuit caused by the fact that the formed contact point is in contact with a plurality of active areas 01 at the same time.

At S104, etching is performed along the first etching pattern to remove the first barrier layer and etch the first dielectric layer to form a conductive channel.

Figure 5A:
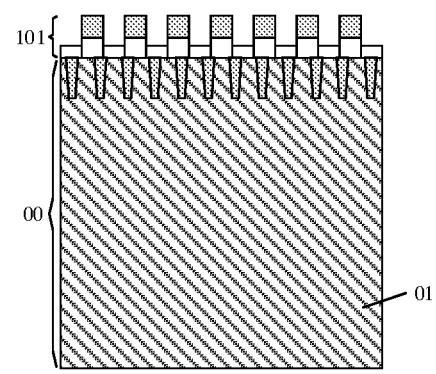
FIG. 5A schematically shows Diagram V of a method for preparing a semiconductor structure according to an embodiment of the disclosure.
Figure 5B:
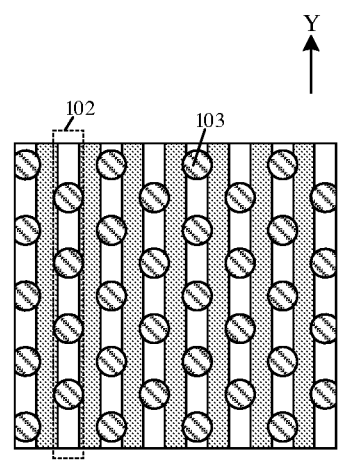
FIG. 5B schematically shows Diagram VI of a method for preparing a semiconductor structure according to an embodiment of the disclosure.

In the embodiment of the disclosure, after forming the first mask including the first etching pattern, etching may be performed by a semiconductor apparatus along the first etching pattern, to remove the first barrier layer and etch the first dielectric layer to form the conductive channel. FIG. 5A and FIG. 5B are a front sectional view and a top view respectively. As shown in FIG. 5A and FIG. 5B, the first dielectric layer 10 is etched to form the conductive channel 101.

Corresponding to the first etching pattern, the conductive channel 101 includes the groove 102 extending in the first direction Y and the uniformly distributed etching holes 103. Herein, the groove 102 penetrates through the etching holes 103. The active area 01 may be exposed at the position of the etching hole 103, while the active area 01 may be not exposed at the position of the groove 102. The diameter of each etching hole 103 is larger than the width of the groove 102.

In the embodiment of the disclosure, the first barrier layer 20 may be first etched by a semiconductor apparatus along the first etching pattern to transfer the first etching pattern onto the first barrier layer 20, then etching may continue along the first etching pattern on the first barrier layer 20 to remove the first barrier layer 20, and etch the first dielectric layer 10 to form the conductive channel 101. In this way, the first barrier layer plays the protection and buffering effects.

It is to be understood that in the embodiment of the disclosure, first, the first dielectric layer 10 and the first barrier layer 20 are deposited on the substrate 00 in sequence; then, the first mask 301 including the first etching pattern is formed on the first barrier layer 20; after that, etching is performed along the first etching pattern, to remove the first barrier layer 20 and etch the first dielectric layer 10 to form the conductive channel 101. In addition, the first etching pattern includes the groove 302 extending in the first direction Y and the uniformly distributed etching holes 303, the groove 302 penetrates through the etching hole 303, and the depth of the etching hole 303 is larger than that of the groove 302. Therefore, corresponding to the first etching pattern, the conductive channel 101 also includes a groove 102 extending in the first direction Y and uniformly distributed etching holes 103, in which the groove 102 penetrates through the etching holes 103, and the active area 01 may be exposed at the position of the etching hole 103, while the active area 01 may be not exposed at the position of the groove 102. In this way, the groove 102 provides an embedded area for metal wiring, the etching hole 103 provides a contact point between the metal wiring and the active area, and the formation of the first etching pattern only requires photomasking twice. Therefore, a novel semiconductor structure capable of performing metal wiring is formed with less times of photomasking, thereby providing a new choice for semiconductor technology.

Meanwhile, by controlling the shape and size of the etching hole, the area of the contact point can be increased without causing a short circuit, so that there is a better electric contact between the metal wiring and the active area, thereby reducing the contact resistance, reducing the risk of poor contact, and improving the performance of the semiconductor device.

Figure 6:
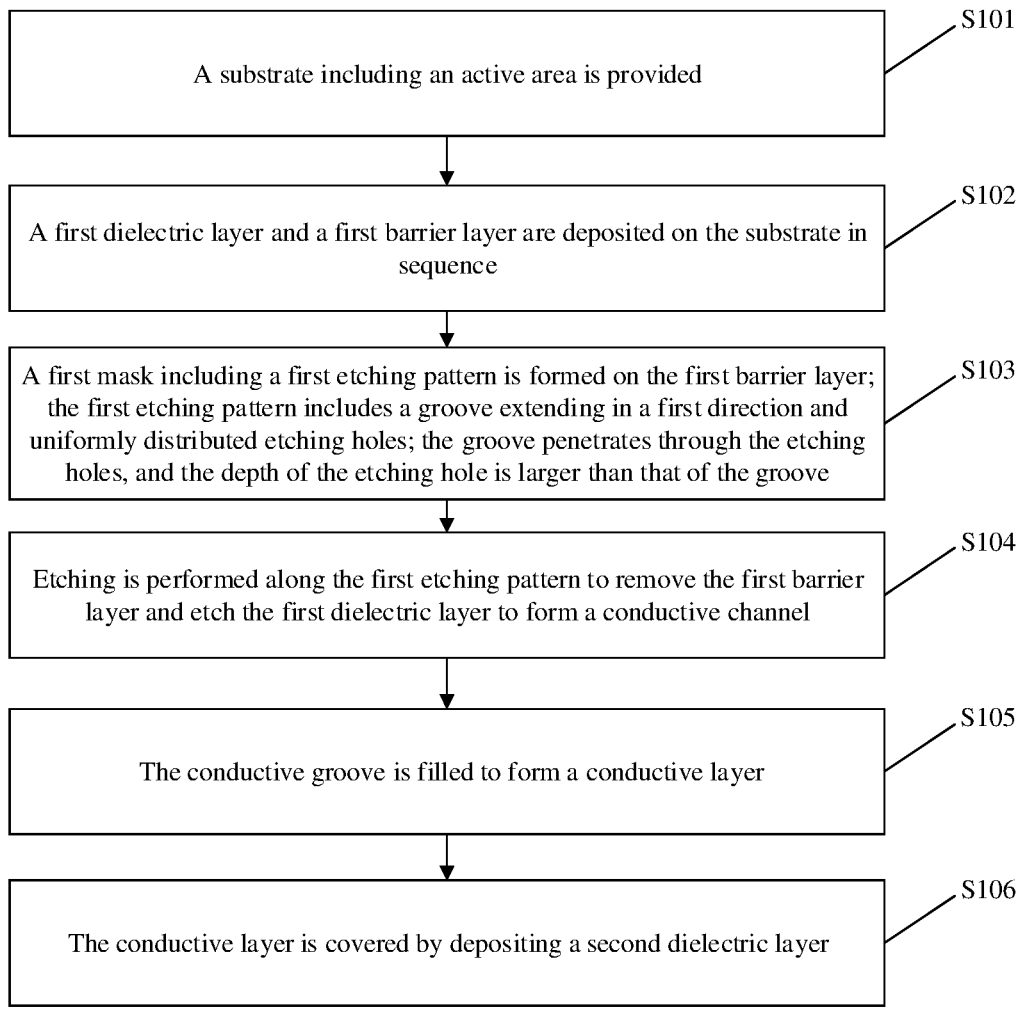
FIG. 6 schematically shows Flowchart II of a method for preparing a semiconductor structure according to an embodiment of the disclosure.

In some embodiments of the disclosure, the method further includes S105 to S106 shown in FIG. 6, after S104 shown in FIG. 1, which will be explained with reference to each step.

At S105, the conductive channel is filled to form a conductive layer.

Figure 7A:
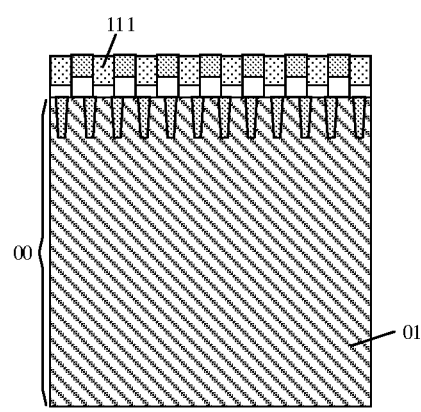
FIG. 7A schematically shows Diagram VII of a method for preparing a semiconductor structure according to an embodiment of the disclosure.
Figure 7B:
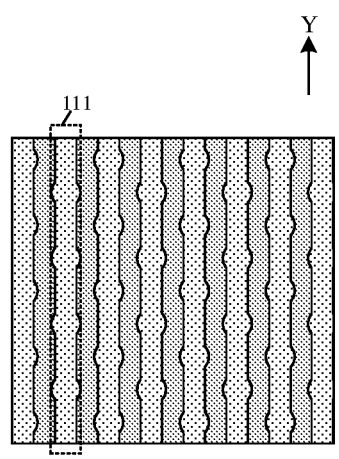
FIG. 7B schematically shows Diagram VIII of a method for preparing a semiconductor structure according to an embodiment of the disclosure.

In the embodiment of the disclosure, FIG. 7A and FIG. 7B are a front sectional view and a top view respectively. Combined with FIG. 5A, FIG. 5B, FIG. 7A and FIG. 7B, by a semiconductor apparatus, the conductive channel 101 may be filled with a dielectric to form the conductive layer 111.

The conductive layer 111 fills the groove 102 and the etching holes 103, the active area 01 is exposed at the position of the etching hole 103, but is not exposed at the position of the groove 102. Therefore, an electrical contact is formed between the conductive layer 111 and the active area 01 at the corresponding position of the etching hole 103, while electrical contact is not formed between the conductive layer 111 and the active area 01 at the corresponding position of the groove 102, since the conductive layer 111 and the active area 01 are blocked by the remaining first dielectric layer 10.

In the embodiment of the disclosure, the dielectric filled in the conductive channel 101 includes a metal isolation layer and a metal layer. If the metal material is directly contacted with the active area, it will diffuse into the active area and destroy the electrical characteristics of the active area, Therefore, by a semiconductor apparatus, the metal isolation layer may be first deposited in the etching hole 103 to prevent the metal material diffusing into the active area 01, and then, the metal layer is deposited on the metal isolation layer to fill the residual space of the conductive channel 101, so that the conductive layer 111 is formed. Herein, the material of the metal layer may be tungsten (W) or copper (Cu), and the material of the metal isolation layer may be titanium nitride (TiN).

At S106, a second dielectric layer is deposited to cover the conductive layer.

Figure 8:
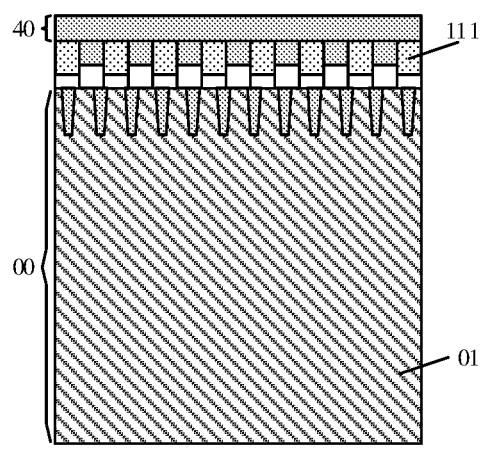
FIG. 8 schematically shows Diagram IX of a method for preparing a semiconductor structure according to an embodiment of the disclosure.

In the embodiment of the disclosure, FIG. 8 is a front sectional view. As shown in FIG. 8, after forming the conductive layer 111, the second dielectric layer 40 may be deposited by a semiconductor apparatus to cover the conductive layer 111 and insulate the conductive layer 111 from other areas. Herein, the material of the second dielectric layer 40 may be silicon nitride.

It is to be understood that the dielectric is filled in the conductive channel to form the conductive layer. The conductive layer is in contact with the active area at the position of the etching hole, and may form better electrical contact with the active area, thereby reducing the contact resistance, reducing the risk of poor contact, and improving the performance of the semiconductor device.

Figure 9:
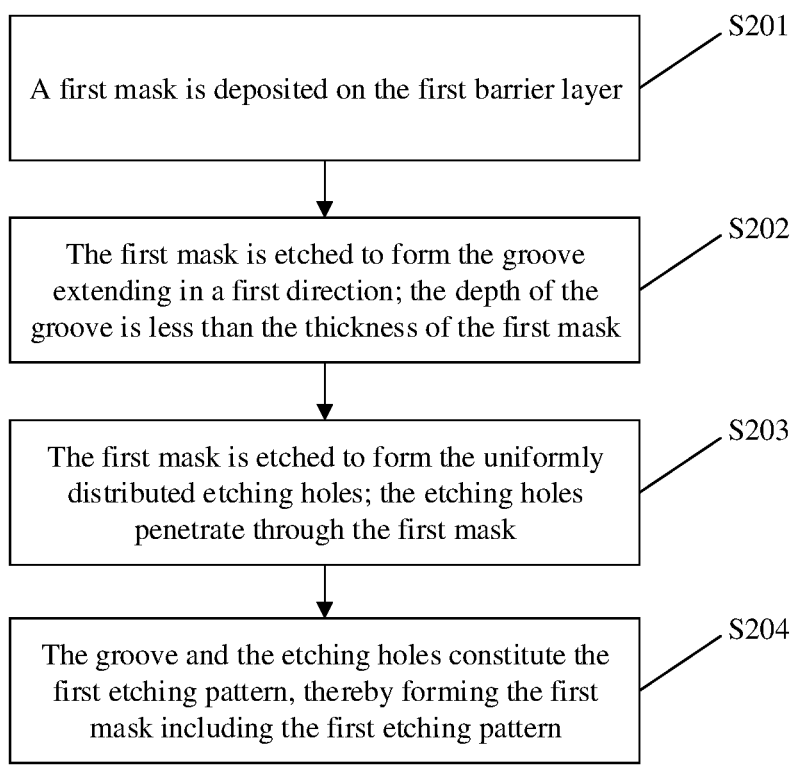
FIG. 9 shows Flowchart III of a method for preparing a semiconductor structure according to an embodiment of the disclosure.

In some embodiments of the disclosure, S103 shown in FIG. 1 may be implemented through S201 to S204 shown in FIG. 9, which will be explained with reference to each step.

At 201, the first mask is deposited on the first barrier layer.

Figure 10:
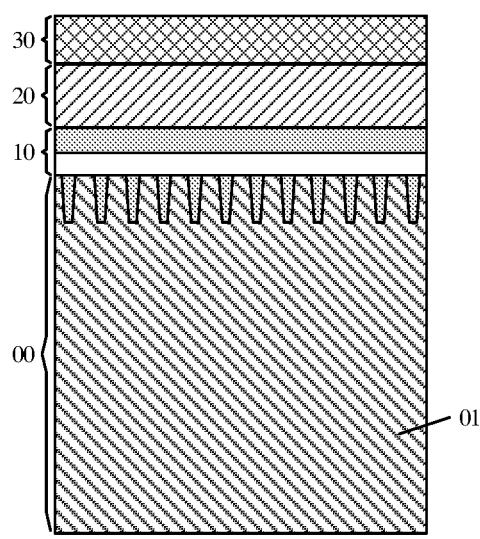
FIG. 10 schematically shows Diagram X of a method for preparing a semiconductor structure according to an embodiment of the disclosure.

In the embodiment of the disclosure, FIG. 10 is a front sectional view. As shown in FIG. 10, the first mask 30 may be deposited on the first barrier layer 20 by a semiconductor apparatus. The first mask 30 may be Si Anti-Reflection coating (SiARC), main material of which is organosiloxane.

At 202, the first mask is etched to form the groove extending in the first direction. The depth of the groove is less than the thickness of the first mask.

Figure 11A:
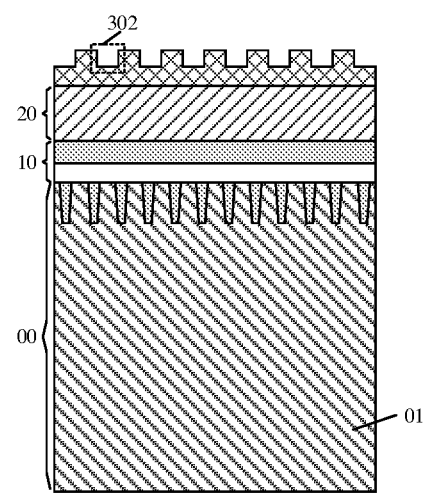
FIG. 11A schematically shows Diagram XI of a method for preparing a semiconductor structure according to an embodiment of the disclosure.
Figure 11B:
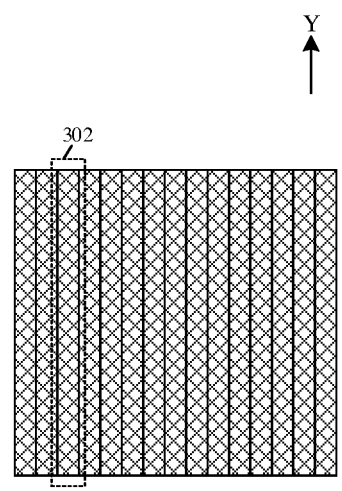
FIG. 11B schematically shows Diagram XII of a method for preparing a semiconductor structure according to an embodiment of the disclosure.

In the embodiment of the disclosure, FIG. 11A and FIG. 11B are a front sectional view and a top view respectively. Combined with FIG. 10, FIG. 11A and FIG. 11B, the first mask 30 is etched by a semiconductor apparatus to form the groove 302 extending in the first direction Y. Herein, the grooves 302 are arranged at intervals. The depth of the groove 302 is less than the thickness of the first mask, that is, the groove 302 does not penetrate through the first mask 30.

At S203, the first mask is etched to form the uniformly distributed etching holes. The etching holes penetrate through the first mask.

In the embodiment of the disclosure, combined with FIG. 11A, FIG. 11B, FIG. 3A and FIG. 3B, after forming the groove 302, the first mask 30 may be etched again by a semiconductor apparatus to form the uniformly distributed etching holes 303. Herein, the groove 302 penetrates through the etching holes 303. The etching holes 303 penetrate through the first mask 30 to expose the first barrier layer 20. That is, the depth of the etching hole 303 is larger than that of the groove 302. The diameter of each etching hole 303 is larger than the width of the groove 302.

At 204, the groove and the etching hole constitute the first etching pattern, thereby forming the first mask including the first etching pattern.

In the embodiment of the disclosure, as shown in FIG. 3A and FIG. 3B, the groove 302 and the etching hole 303 constitute the first etching pattern, thereby forming the first mask 301 including the first etching pattern.

It is to be understood that through two times of etching, the groove 302 and the etching hole 303 are respectively formed on the first mask 30 to constitute the first etching pattern. Therefore, the first mask 30 is utilized to form the finally needed first etching pattern, so that the damage risk caused by directly etching the first dielectric layer is avoided, and the yield is improved.

Figure 12:
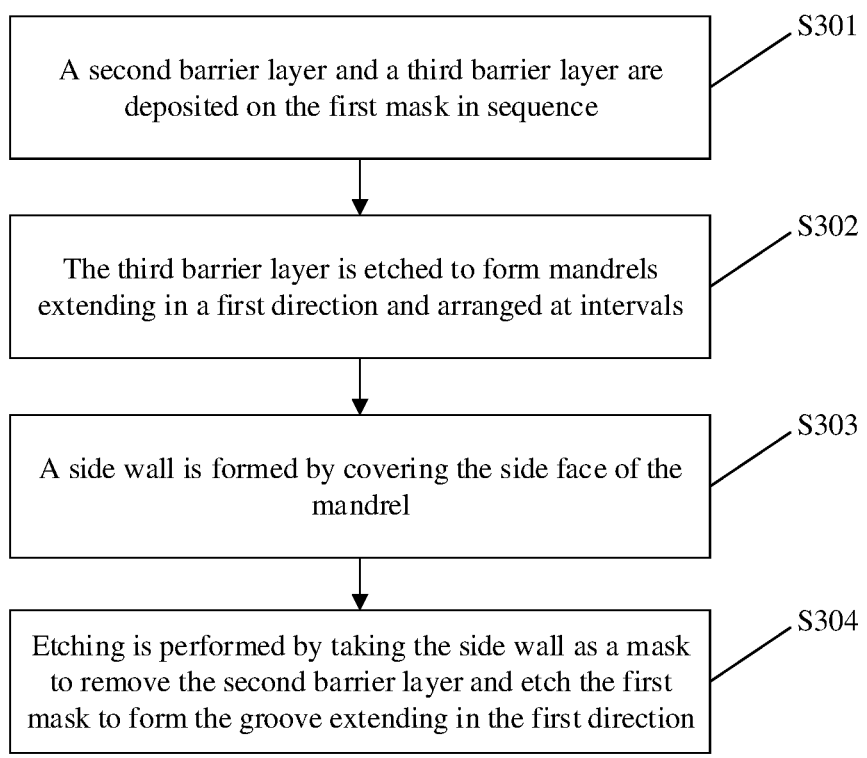
FIG. 12 shows Flowchart IV of a method for preparing a semiconductor structure according to an embodiment of the disclosure.

In some embodiments of the disclosure, S202 shown in FIG. 9 may be implemented through S301 to S304 shown in FIG. 12, which will be explained with reference to each step.

At 301, a second barrier layer and a third barrier layer are deposited on the first mask in sequence.

Figure 13A:
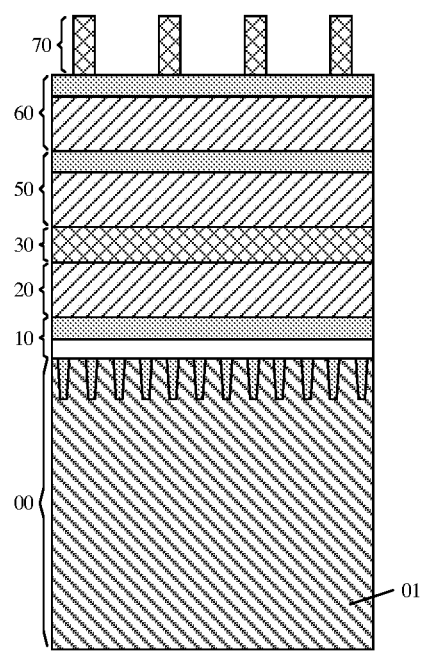
FIG. 13A schematically shows Diagram XIII of a method for preparing a semiconductor structure according to an embodiment of the disclosure.
Figure 13B:
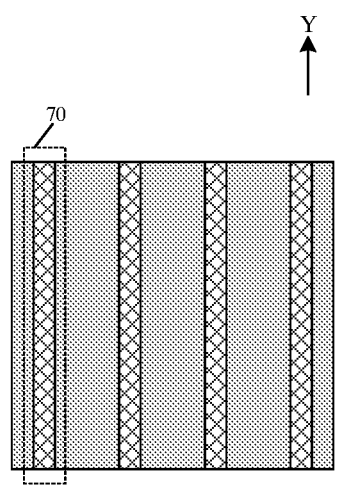
FIG. 13B schematically shows Diagram XIV of a method for preparing a semiconductor structure according to an embodiment of the disclosure.

In the embodiment of the disclosure, FIG. 13A and FIG. 13B are a front sectional view and a top view respectively. As shown in FIG. 13A and FIG. 13B, a semiconductor apparatus, the second barrier layer 50 and the third barrier layer 60 may be deposited on the first mask 30 in sequence. The materials of the second barrier layer 50 and the third barrier layer 60 may include SiOH (silicon oxynitride) and SOH.

It is to be noted that the barrier layer is configured to form a downward transfer pattern as required and protect areas that do not need be etched during etching.

At S302, the third barrier layer is etched to form mandrels extending in the first direction and arranged at intervals.

In the embodiment of the disclosure, the third barrier layer may be etched by a semiconductor apparatus to form the mandrels extending in the first direction and arranged at intervals.

In the embodiment of the disclosure, as shown in FIG. 13A and FIG. 13B, by a semiconductor apparatus, the second mask 70 may be first formed on the third barrier layer 60 through a lithography process, and the shape of the second mask 70 is characterized as a second etching pattern extending in the first direction Y. Then, the third barrier layer 60 may be etched along the second etching pattern by a semiconductor apparatus to form the mandrels 601 shown in FIG. 14A and FIG. 14B. The mandrels 601 extend in the first direction Y and are arranged at intervals.

At S303, a side wall covering the side face of the mandrel is formed.

In the embodiment of the disclosure, by a semiconductor apparatus, the side face of the mandrel may be covered to form the side wall.

Figure 15A:
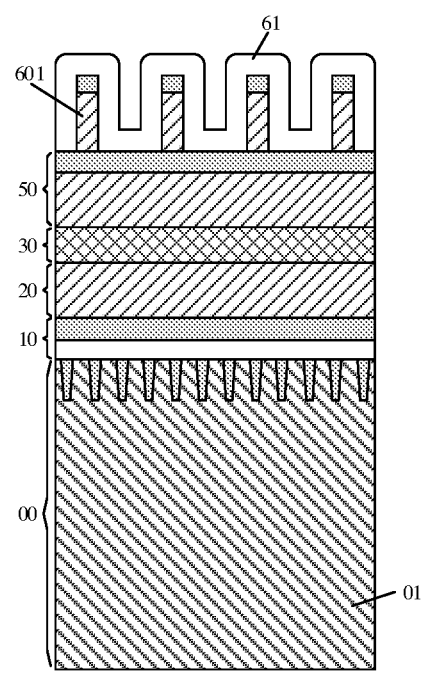
FIG. 15A schematically shows Diagram XVII of a method for preparing a semiconductor structure according to an embodiment of the disclosure.
Figure 15B:
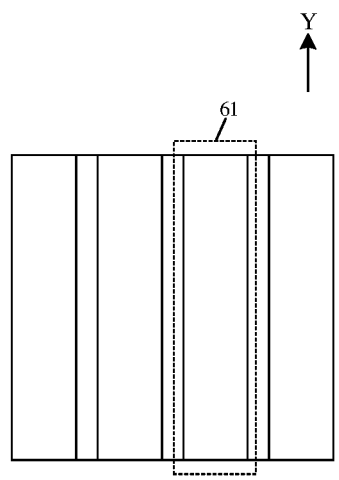
FIG. 15B schematically shows Diagram XVII of a method for preparing a semiconductor structure according to an embodiment of the disclosure.

In the embodiment of the disclosure, FIG. 15A and FIG. 15B are a front sectional view and a top view respectively. As shown in FIG. 15A and FIG. 15B, a hard mask layer 61 may be first deposited by a semiconductor apparatus through an Atomic Layer Deposition (ALD) process to cover the first barrier layer 50 and the mandrel 601.

Figure 16A:
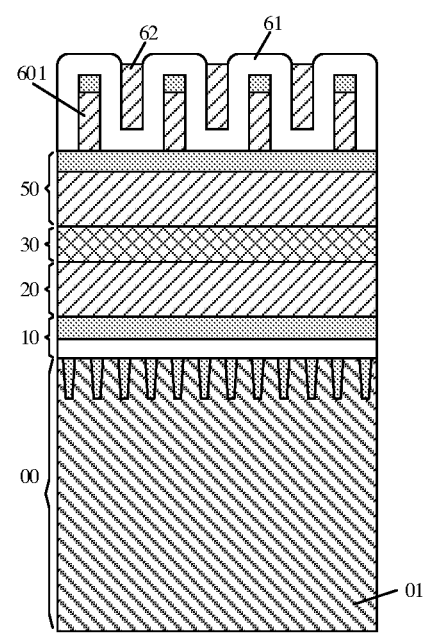
FIG. 16A schematically shows Diagram XIX of a method for preparing a semiconductor structure according to an embodiment of the disclosure.
Figure 16B:
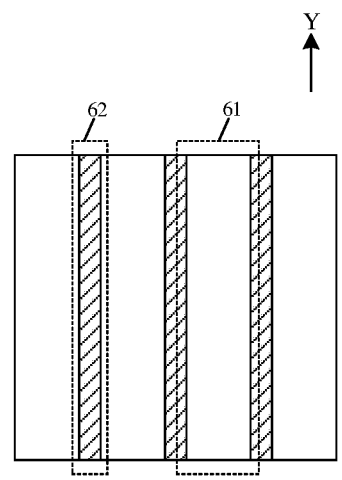
FIG. 16B schematically shows Diagram XX of a method for preparing a semiconductor structure according to an embodiment of the disclosure.

Then, FIG. 16A and FIG. 16B are a top view and a front sectional view respectively. As shown in FIG. 16A and FIG. 16B, by a semiconductor apparatus, a gap between the hard mask layers 61 is filled with a third dielectric layer 62, which acts as a barrier layer in subsequent etching.

Figure 17A:
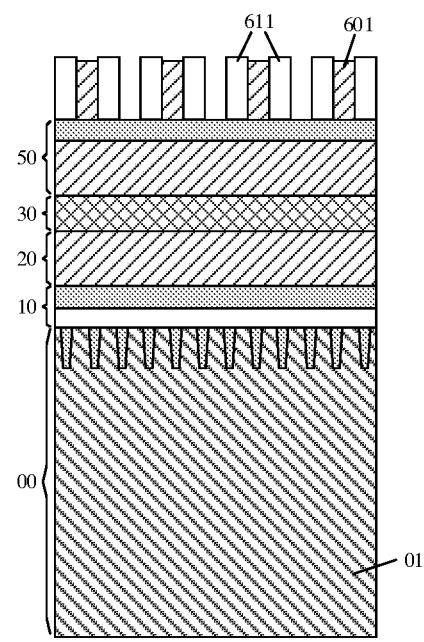
FIG. 17A schematically shows Diagram XXI of a method for preparing a semiconductor structure according to an embodiment of the disclosure.
Figure 17B:
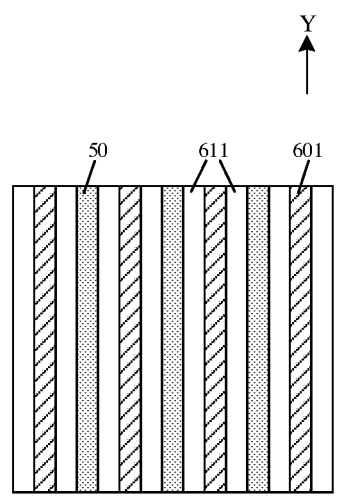
FIG. 17B schematically shows Diagram XXII of a method for preparing a semiconductor structure according to an embodiment of the disclosure.

Then, the hard mask layer 61 may be etched back by a semiconductor apparatus, to remove the hard mask layer 61 from the top thereof until the mandrel 601 is exposed, and retain the sidepiece of the hard mask layer 61 as the side wall 611, as shown in FIG. 17A and FIG. 17B. The side wall 611 also extends in the first direction Y.

At S304, etching is performed by taking the side wall as a mask to remove the second barrier layer, and etch the first mask to form the groove extending in the first direction.

In the embodiment of the disclosure, by a semiconductor apparatus, etching may be performed by taking the side wall as the mask to remove the second barrier layer, and etch the first mask etched to form the groove extending in the first direction.

Figure 18A:
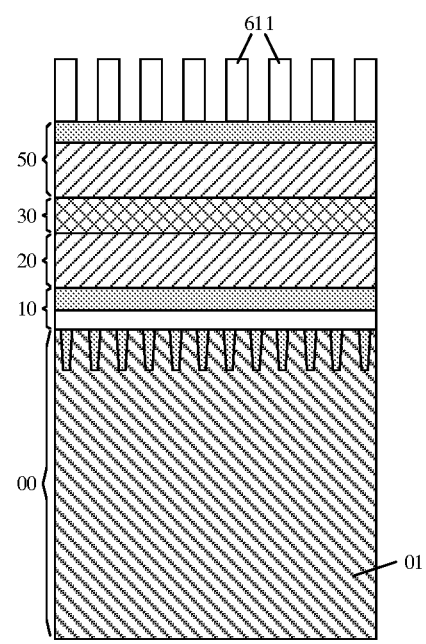
FIG. 18A schematically shows Diagram XXIII of a method for preparing a semiconductor structure according to an embodiment of the disclosure.
Figure 18B:
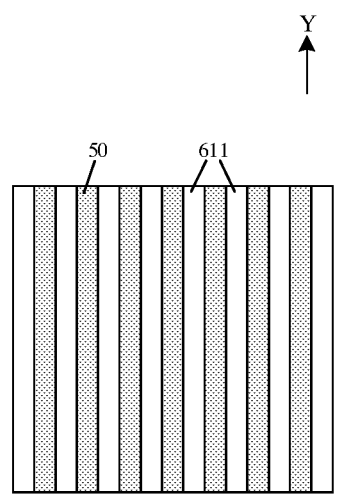
FIG. 18B schematically shows Diagram XXIV of a method for preparing a semiconductor structure according to an embodiment of the disclosure.

In the embodiment of the disclosure, referring to FIG. 17A and FIG. 17B, the mandrel 601 presents between the side walls 611. By a semiconductor apparatus, etching may be first performed with high selectivity etching rate to remove the mandrel 601 present between the side walls 611. Herein, the high selectivity means that the etching rate of the material of the mandrel 601 is much higher than that of other materials. The obtained structure is shown in FIG. 18A and FIG. 18B.

Figure 19A:
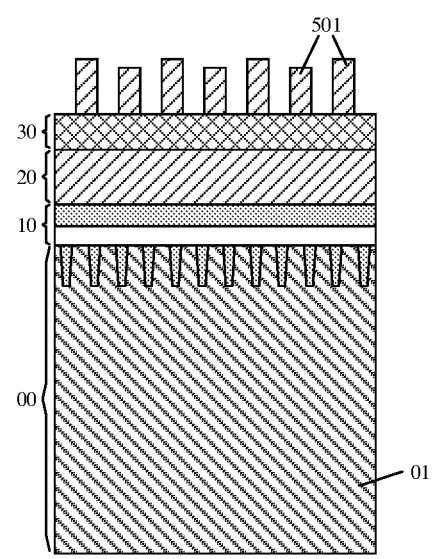
FIG. 19A schematically shows Diagram XXV of a method for preparing a semiconductor structure according to an embodiment of the disclosure.
Figure 19B:
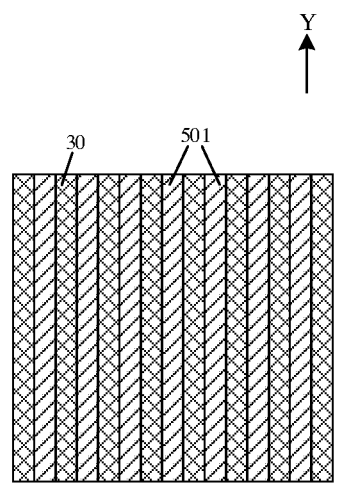
FIG. 19B schematically shows Diagram XXVI of a method for preparing of a semiconductor structure according to an embodiment of the disclosure.

Then, by a semiconductor apparatus, the second barrier layer 50 may be etched by taking the side wall 611 as a mask to form a first intermediate structure 501 shown in FIG. 19A and FIG. 19B, and expose the first mask 30. As shown in FIG. 19B, the first intermediate structure 501 also extends in the first direction Y as the side wall 611, and the first mask 30 is exposed at the gap between the first intermediate structures 501.

Figure 20A:
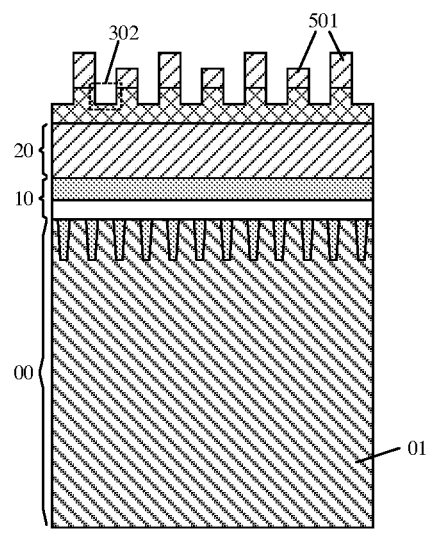
FIG. 20A schematically shows Diagram XXVII of a method for preparing a semiconductor structure according to an embodiment of the disclosure.
Figure 20B:
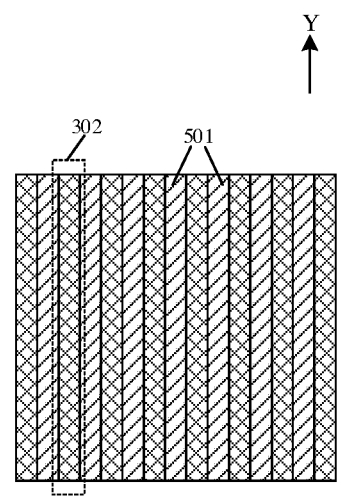
FIG. 20B schematically shows Diagram XXVIII of a method for preparing a semiconductor structure according to an embodiment of the disclosure.

Then, by a semiconductor apparatus, the first mask 30 may be etched by taking the first intermediate structure 501 as a mask to obtain the structure shown in FIG. 20A and FIG. 20B. The first mask 30 is etched to form the groove 302 at the gap between the first intermediate structures 201.

Then, by a semiconductor apparatus, the remaining first intermediate structure 501 may be removed to obtain the structure shown in FIG. 11A and FIG. 11B.

It is to be understood that in the embodiment of the disclosure, after depositing the second barrier layer 50 and the third barrier layer 60, by a semiconductor apparatus, the second mask 70 is first formed through the lithography process, and then etching is performed along the second mask 70 to form the mandrel 601. Then, the side wall 611 covering the side face of the mandrel 601 is formed. Finally, etching is performed by taking the side wall 611 as the mask to form the groove 302. Due to the fact that the side walls 611 are formed in the spacer regions among the mandrels 601, the distance between two side walls is less than that between two mandrels 601. Therefore, the width of the groove 302 formed by taking the side wall 611 as the mask is also less than the distance between the mandrels 601. In this way, even if the lithography process limits the key size that may be achieved, the groove 302 with smaller key size can be formed by means of the mandrel 601, which expands the process size limit that may be achieved by the semiconductor device.

In some embodiments of the disclosure, S302 shown in FIG. 12 may be implemented through S3021 to S3022, which will be explained with reference to each step.

At S3021, the second mask is formed on the third barrier layer. The second mask includes the second etching pattern extending in the first direction.

In the embodiment of the disclosure, by a semiconductor apparatus, the second mask may be first formed on the third barrier layer. Herein, the second mask may be obtained through the lithography process. FIG. 13A and FIG. 13B illustrate the second mask and are a top view and a front sectional views respectively. As shown in FIG. 13A and FIG. 13B, the second mask 70 is formed on the third barrier layer 60, and the second etching pattern of the second mask 70 extends in the first direction Y.

At S3022, the third barrier layer is etched along the second etching pattern to form the mandrel extending in the first direction.

Figure 14A:
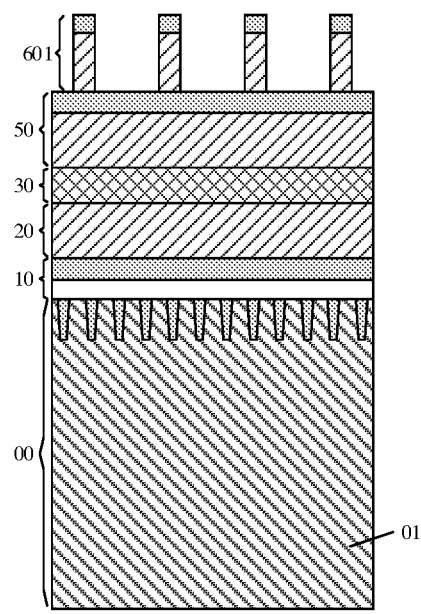
FIG. 14A schematically shows Diagram XV of a method for preparing a semiconductor structure according to an embodiment of the disclosure.
Figure 14B:
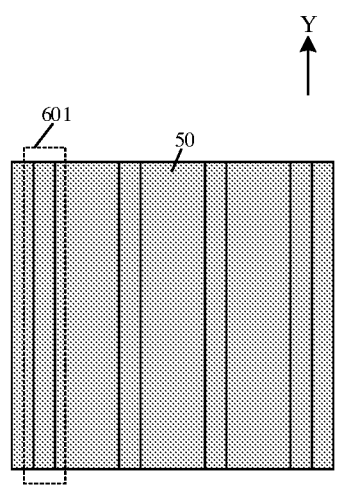
FIG. 14B schematically shows Diagram XVI of a method for preparing a semiconductor structure according to an embodiment of the disclosure.

In the embodiment of the disclosure, after forming the second mask 70, the third barrier layer 60 may be etched along the second etching pattern by a semiconductor apparatus, to form the mandrel 601 shown in FIG. 14A and FIG. 14B. The mandrel 601 also extends in the first direction Y.

In some embodiments of the disclosure, S303 shown in FIG. 12 may be implemented through S3031 to S3032, which will be explained with reference to each step.

At S3031, the hard mask layer is deposited. The hard mask layer covers the second barrier layer and the mandrel.

In the embodiment of the disclosure, as shown in FIG. 15A and FIG. 15B, the hard mask layer 61 may be first deposited by a semiconductor apparatus, through the ALD process to cover the second barrier layer 50 and the mandrel 601.

At S3032, the hard mask layer is etched back, to remove the hard mask layer from the top thereof until the mandrel is exposed, and retain the sidepiece of the hard mask layer as the side wall.

In the embodiment of the disclosure, after depositing the hard mask layer 61, the hard mask layer 61 may be etched back by a semiconductor apparatus, to remove the hard mask layer 61 from the top thereof until the mandrel 601 is exposed, and retain the sidepiece of the hard mask layer 61 as the side wall 611, as shown in FIG. 17A and FIG. 17B.

In some embodiments of the disclosure, S304 shown in FIG. 12 may be implemented through S3041 to S3043, which will be explained with reference to each step.

At S3041, the mandrel between the side walls is removed.

In the embodiment of the disclosure, referring to FIG. 17A and FIG. 17B, the mandrel 601 presents between the side walls 611. By a semiconductor apparatus, etching may be first performed with high selectivity etching rate to remove the remaining mandrel 601 between the side walls 611, thereby obtaining the structure shown in FIG. 18A and FIG. 18B.

At S3042, the second barrier layer is etched by taking the side wall as the mask to form the first intermediate structure.

In the embodiment of the disclosure, after removing the remaining mandrel 601 between the side walls 611, the second barrier layer 50 may be etched by taking the side wall 611 as the mask to form the first intermediate structure 501 shown in FIG. 19A and FIG. 19B, and expose the first mask 30. As shown in FIG. 19B, the first intermediate structure 501 extends in the first direction Y, and the first mask 30 is exposed at the gap between first intermediate structures 501.

At S3043, the first mask is etched by taking the first intermediate structure as the mask to form the groove extending in the first direction.

In the embodiment of the disclosure, after forming the first intermediate structure 501 shown in FIG. 19B by a semiconductor apparatus, the first mask 30 is first etched according to the etching rate ratio by taking the first intermediate structure 501 as the mask, so as to form the groove 302 shown in FIG. 11A and FIG. 11B. The groove 302 extends in the first direction Y.

Figure 21:
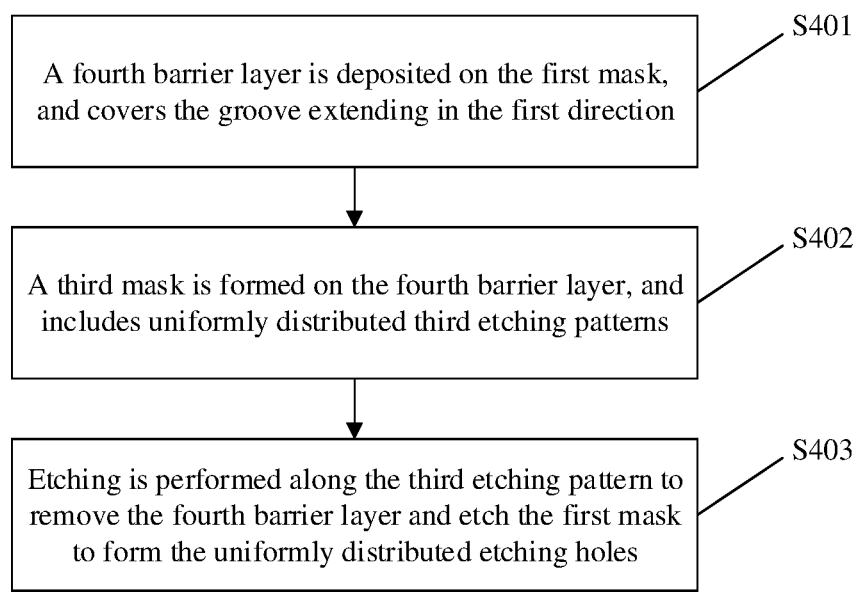
FIG. 21 shows Flowchart V of a method for preparing a semiconductor structure according to an embodiment of the disclosure.

In some embodiments of the disclosure, S203 shown in FIG. 9 may be implemented through S401 to S403 shown in FIG. 21, which will be explained with reference to each step.

At S401, a fourth barrier layer is deposited on the first mask. The fourth barrier layer covers the groove extending in the first direction.

Figure 22A:
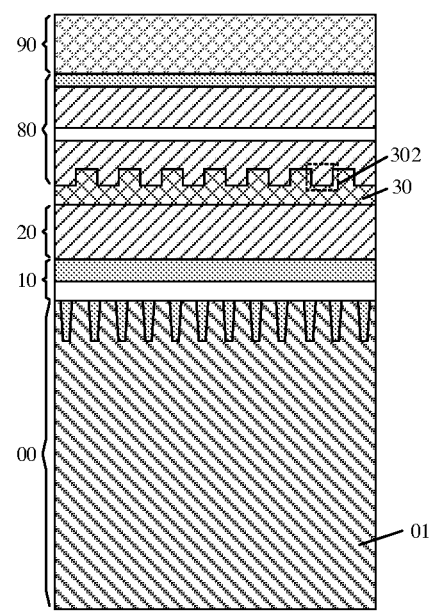
FIG. 22A schematically shows Diagram XXIX of a method for preparing a semiconductor structure according to an embodiment of the disclosure.
Figure 22B:
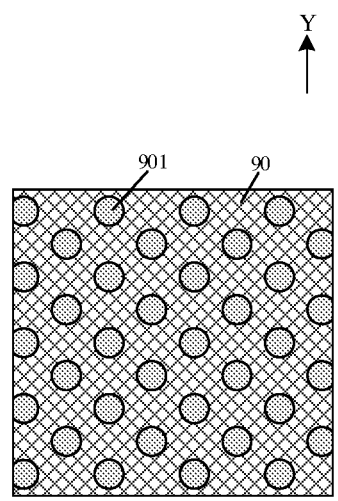
FIG. 22B schematically shows Diagram XXX of a method for preparing a semiconductor structure according to an embodiment of the disclosure.

In the embodiment of the disclosure, FIG. 22A and FIG. 22B are a front sectional view and a top view respectively. As shown in FIG. 22A and FIG. 22B, after forming the groove 302 extending in the first direction Y on the first mask 30, the fourth barrier layer 80 may be deposited on the first mask 30. The fourth barrier layer 80 covers the groove 302.

It is to be noted that the barrier layer is configured to form the downward transfer pattern as required and protect areas that do not need to be etched during etching.

At S402, a third mask is formed on the fourth barrier layer. The third mask includes uniformly distributed third etching patterns.

In the embodiment of the disclosure, as shown in FIG. 22A and FIG. 22B, after depositing the fourth barrier layer 80, the third mask 90 may be formed on the fourth barrier layer 80 by a semiconductor apparatus through the lithography process. The third mask 90 includes the uniformly distributed third etching patterns. The third etching patterns are specifically characterized as uniformly distributed etching holes 901. The etching holes 901 may penetrate through the third mask 90 to expose the fourth barrier layer 80.

In the embodiment of the disclosure, during the formation of the third mask 90, the third etching pattern needs to be aligned with the groove 302 below, so that the projection pattern of the third etching pattern and the groove 302 can constitute the first etching pattern. That is, the groove 302 may penetrate through the projection pattern of the etching hole 901.

In the embodiment of the disclosure, the shape of the etching hole 901 is circular. The diameter of each etching hole 901 is larger than the width of the groove 302. Therefore, a lager contact point may be finally formed with the active area 01. The projection of each etching hole 901 covers at most one active area 01, thereby avoiding a short circuit caused by the fact that the formed contact point is in contact with a plurality of active areas 01 at the same time.

At 403, etching is performed along the third etching pattern to remove the fourth barrier layer and etch the first mask to form the uniformly distributed etching holes.

In the embodiment of the disclosure, combined with FIG. 22A, FIG. 22B, FIG. 3A and FIG. 3B, etching may be performed along the third etching pattern by a semiconductor apparatus, to remove the fourth barrier layer 80 and etch the first mask 30 to form the uniformly distributed etching holes 303.

Figure 23A:
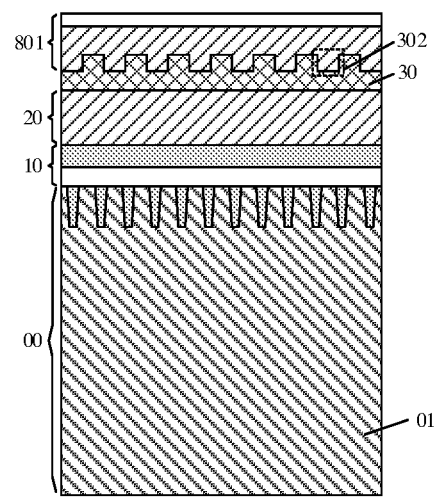
FIG. 23A schematically shows Diagram XXXI of a method for preparing a semiconductor structure according to an embodiment of the disclosure.
Figure 23B:
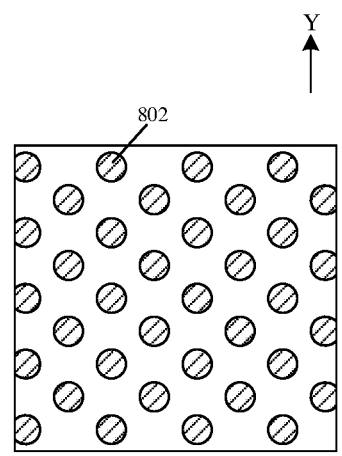
FIG. 23B schematically shows Diagram XXXII of a method for preparing a semiconductor structure preparation method according to an embodiment of the disclosure.

In the embodiment of the disclosure, FIG. 23A and FIG. 23B are a front sectional view and a top view respectively. As shown in FIG. 23A and FIG. 23B, the fourth barrier layer 80 may be first etched along the third etching pattern by a semiconductor apparatus, to form a second intermediate structure 801. The second intermediate structure 801 includes an etching hole 802. That is, the third etching pattern is transferred onto the fourth barrier layer 80. Etching may be then performed by a semiconductor apparatus with taking the second intermediate structure 801 as the mask to penetrate the first mask 30 to form the etching hole 303 shown in FIG. 3B.

It is to be noted that the fourth barrier layer 80 may be composed of a plurality of different materials, such as silicon oxynitride, SOH, and silicon oxide. In the machining process, the fourth barrier layer 80 may be etched with different etching rate ratios for a plurality of times by utilizing the properties of different materials, so as to control the depth of the etching hole to meet expectations.

It is to be understood that the etching hole 303 is aligned with the groove 302 and formed on the first mask 30, thereby forming the first etching pattern. The fourth barrier layer 80 is etched with different etching rate ratios for a plurality of times by utilizing the material properties of the fourth barrier layer 80, so that the depth of the etching hole can be controlled, thereby finally exposing the active area at the corresponding position of the etching hole and forming an effective active area contact point. Meanwhile, a proper photomask is selected to control the size of the etching hole 303, so that the area of the finally formed contact point may be increased without causing a short circuit, thereby reducing the contact resistance, reducing the risk of poor contact, and improving the performance of the semiconductor device.

In some embodiments of the disclosure, S403 shown in FIG. 21 may be implemented through S4031 to S4032, which will be explained with reference to each step.

At S4031, the fourth barrier layer is etched along the third etching pattern to form the second intermediate structure.

In the embodiment of the disclosure, as shown in FIG. 23A and FIG. 23B, the fourth barrier layer 80 may be formed along the third etching pattern by a semiconductor apparatus to form the second intermediate structure 801. That is, the third etching pattern is transferred onto the fourth barrier layer 80.

At 4032, etching is performed by taking the second intermediate structure as the mask, to penetrate the first mask to form the uniformly distributed etching holes.

In the embodiment of the disclosure, etching may be further performed by a semiconductor apparatus with taking the second intermediate structure 801 as the mask to penetrate the first mask 30 to form the etching holes 303 shown in FIG. 3B.

Figure 24:
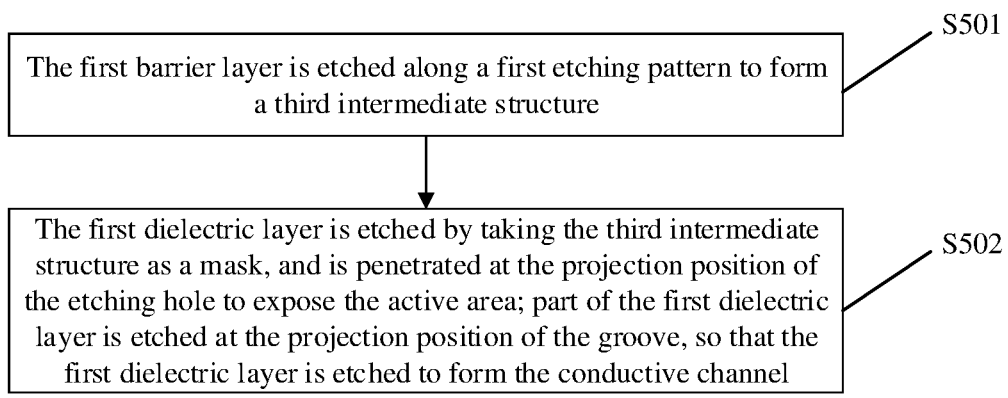
FIG. 24 shows Flowchart VI of a method for preparing a semiconductor structure according to an embodiment of the disclosure.

In some embodiments of the disclosure, S104 shown in FIG. 1 may be implemented through S501 to S502 shown in FIG. 24, which will be explained with reference to each step.

At S501, the first barrier layer is etched along the first etching pattern to form a third intermediate structure.

Figure 25A:
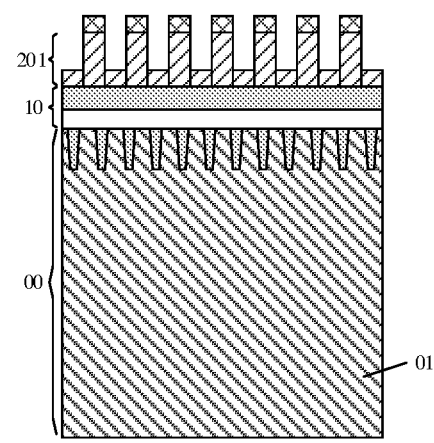
FIG. 25A schematically shows Diagram XXXIII of a method for preparing a semiconductor structure according to an embodiment of the disclosure.
Figure 25B:
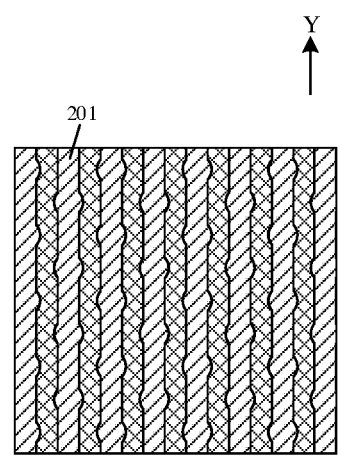
FIG. 25B schematically shows Diagram XXXIV of a method for preparing a semiconductor structure according to an embodiment of the disclosure.

In the embodiment of the disclosure, FIG. 25A and FIG. 25B are a front sectional view and a top view respectively. Combined with FIG. 3A, FIG. 3B, FIG. 25A and FIG. 25B, the first barrier 20 is etched along the first etching pattern 301 by a semiconductor apparatus, to transfer the first etching pattern 301 onto the first barrier layer 20 to form the third intermediate structure 201. Corresponding to the first etching pattern 301, the third intermediate structure 201 also includes the groove and the etching hole, and the depth of the etching hole is larger than that of the groove.

At S502, the first dielectric layer is etched by taking the third intermediate structure as the mask to penetrate the first dielectric layer at the projection position of the etching hole to expose the active area, and etch part of the first dielectric layer at the projection position of the groove, so that the first dielectric layer is etched to form the conductive channel.

Figure 26A:
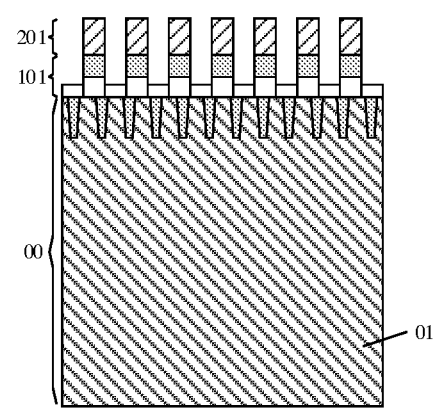
FIG. 26A schematically shows Diagram XXXV of a method for preparing a semiconductor structure according to an embodiment of the disclosure.
Figure 26B:
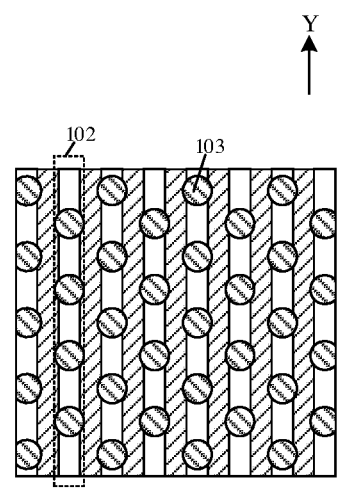
FIG. 26B schematically shows Diagram XXXVI of a method for preparing a semiconductor structure according to an embodiment of the disclosure.

In the embodiment of the disclosure, FIG. 26A and FIG. 26B are a front sectional view and a top view respectively. As shown in FIG. 26A and FIG. 26B, etching may be further performed on the first dielectric layer 10 by a semiconductor apparatus with taking the third intermediate structure 201 as the mask, to penetrate the first dielectric layer 10 at the projection position of the etching hole to expose the active area 01, and etch part of the first dielectric layer 10 at the projection position of the groove simultaneously, so that the first dielectric layer 10 is etched to form the conductive channel 101. Then, etching may be performed by a semiconductor apparatus with high selectivity etching rate to remove the remaining third intermediate structure 201. Herein, the high selectivity means that the etching rate of the material of the third intermediate structure 201 is much higher than that of other materials. The obtained structure is shown in FIG. 5A and FIG. 5B.

Figure 27:
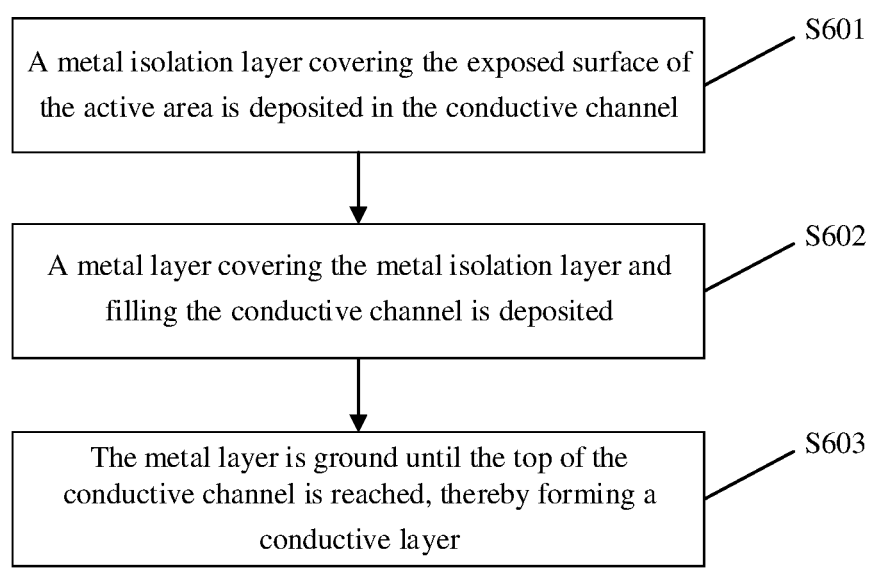
FIG. 27 shows Flowchart VII of a method for preparing a semiconductor structure according to an embodiment of the disclosure.

In some embodiments of the disclosure, S105 shown in FIG. 6 may be implemented through S601 to S602 shown in FIG. 27, which will be explained with reference to each step.

At S601, the metal isolation layer is deposited in the conductive channel. The metal isolation layer covers the exposed surface of the active area.

In the embodiment of the disclosure, referring to FIG. 5A and FIG. 5B, after completing machining of the conductive channel 101, the metal isolation layer may be first deposited in the etching hole 103 of the conductive channel 101 to prevent the metal material diffusing into the active area 01. The material of the metal isolation layer may be titanium nitride (TiN).

At S602, the metal layer is deposited. The metal layer covers the metal isolation layer and fills the conductive channel.

Figure 28:
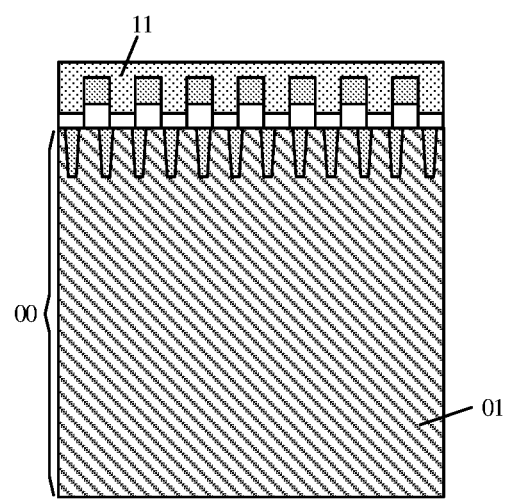
FIG. 28 schematically shows Diagram XXXVII of a method for preparing a semiconductor structure according to an embodiment of the disclosure.

In the embodiment of the disclosure, combined with FIG. 5A, FIG. 5B and FIG. 28, after depositing the metal isolation layer, the metal layer 11 may be deposited on the metal isolation layer, and fills the residual space of the conductive channel 101. The material of the metal layer 11 may be tungsten (W) or copper (Cu).

At S603, the metal layer is ground until the top of the conductive channel is reached, thereby forming the conductive layer.

In the embodiment of the disclosure, combined with FIG. 28, FIG. 7A and FIG. 7B, the metal layer may be ground by a semiconductor apparatus, until the top of the conductive channel 101 is reached, so that the part of the metal layer 11 higher than the top of the conductive channel 101 is removed, forming the conductive layer 111 shown in FIG. 7A and FIG. 7B.

The embodiments of the disclosure further provide a semiconductor structure 08, which is prepared by the preparation method provided by the above embodiment.

Figure 29:
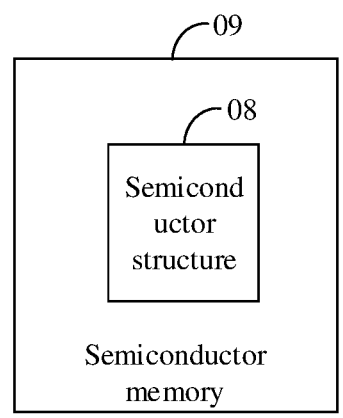
FIG. 29 schematically shows a structure of a semiconductor memory according to an embodiment of the disclosure.

The embodiments of the disclosure further provide a semiconductor memory 09, which as shown in FIG. 29, at least includes the semiconductor structure 08.

In some embodiments of the disclosure, the semiconductor memory 09 shown in FIG. 29 at least includes the DRAM.

It is to be noted that the terms "include", "contain" or any other variations thereof in the present disclosure are intended to cover a non-exclusive inclusion, such that a process, method, article or device including a series of elements not only includes those elements, but also includes those elements that are not explicitly listed, or includes elements inherent to such a process, method, article or device. Under the condition of no more limitations, it is not excluded that additional identical elements further exist in the process, method, article or device including elements defined by a sentence "including a . . . ".

The serial numbers of the embodiments of the disclosure are merely for description and do not represent a preference of the embodiments. The methods disclosed in several method embodiments provided in the present disclosure may be arbitrarily combined without conflict to obtain a new method embodiment. The characteristics disclosed in several product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subjected to the scope of protection of the claims.

INDUSTRIAL APPLICABILITY

The embodiments of the disclosure provide a method for preparing a semiconductor structure, a semiconductor structure, and a semiconductor memory. In the disclosure, a first dielectric layer and a first barrier layer are deposited on the substrate in sequence. Then, a first mask including a first etching pattern is formed on the first barrier layer. Herein, the first etching pattern includes a groove extending in a first direction and uniformly distributed etching holes. The groove penetrates through the etching holes, and the depth of the etching hole is larger than that of the groove. Then, etching is performed along the first etching pattern to remove the first barrier layer and etch the first dielectric layer to form a conductive channel. Corresponding to the first etching pattern, the finally formed conductive channel also includes a groove and an etching hole. In this way, the groove in the conductive channel provides an embedded area for metal wiring, and the etching hole in the conductive channel provides a contact point between the metal wiring and the active area. The formation of the first etching pattern via etching only requires photomasking twice. Therefore, a novel semiconductor structure capable of performing metal wiring is formed with less times of photomasking, thereby providing a new choice for semiconductor technology.

What is claimed is:

1. A method for preparing a semiconductor structure, comprising:
   providing a substrate comprising an active area;
   depositing a first dielectric layer and a first barrier layer on the substrate in sequence;
   forming a first mask comprising a first etching pattern on the first barrier layer; wherein the first etching pattern comprises a groove extending in a first direction and uniformly distributed etching holes; wherein the groove penetrates through the etching holes, and a depth of the etching hole is larger than a depth of the groove; and
   performing etching along the first etching pattern, to remove the first barrier layer and etch the first dielectric layer to form a conductive channel.

2. The method of claim 1, after performing etching along the first etching pattern to remove the first barrier layer and etch the first dielectric layer to form the conductive channel, further comprising:
   filling the conductive channel to form a conductive layer; and
   depositing a second dielectric layer to cover the conductive layer.

3. The method of claim 2, wherein the conductive layer comprises a metal isolation layer and a metal layer; filling the conductive channel to form the conductive layer comprises:

depositing the metal isolation layer in the conductive channel, the metal isolation layer covering a exposed surface of the active area;

depositing the metal layer covering the metal isolation layer and filling the conductive channel; and grinding the metal layer until a top of the conductive channel is reached, thereby forming the conductive layer.

4. The method of claim 1, wherein the formation of the first mask comprising the first etching pattern on the first barrier layer comprises:

depositing the first mask on the first barrier layer;

etching the first mask to form the groove extending in the first direction, the depth of the groove being less than a thickness of the first mask; and etching the first mask to form the uniformly distributed etching holes, the etching holes penetrating through the first mask;

wherein the groove and the etching holes constitute the first etching pattern, thereby forming the first mask comprising the first etching pattern.

5. The method of claim 4, wherein etching the first mask to form the groove extending in the first direction comprises:

depositing a second barrier layer and a third barrier layer on the first mask in sequence;

etching the third barrier layer to form mandrels extending in the first direction and arranged at intervals;

forming a side wall by covering the side face of the mandrel; and performing etching by taking the side wall as a mask, to remove the second barrier layer and etch the first mask to form the groove extending in the first direction.

6. The method of claim 5, wherein etching the third barrier layer to form mandrels extending in the first direction comprises:

forming a second mask on the third barrier layer, the second mask comprising a second etching pattern extending in the first direction; and etching the third barrier layer along the second etching pattern to form the mandrels extending in the first direction.

7. The method of claim 5, wherein forming the side wall by covering the side face of the mandrel comprises:

depositing a hard mask layer covering the second barrier layer and the mandrel; and etching back the hard mask layer, to remove the hard mask layer from a top thereof until the mandrel is exposed, and retain a sidepiece of the hard mask layer as the side wall.

8. The method of claim 5, wherein performing etching by taking the side wall as the mask, to remove the second barrier layer and etch the first mask to form the groove extending in the first direction comprises:

removing the mandrel between side walls;

etching the second barrier layer by taking the side wall as a mask to form a first intermediate structure; and etching the first mask by taking the first intermediate structure as a mask to form the groove extending in the first direction.

9. The method of claim 4, wherein etching the first mask to form the uniformly distributed etching holes comprises:

depositing a fourth barrier layer on the first mask, the fourth barrier layer covering the groove extending in the first direction;

forming a third mask on the fourth barrier layer, the third mask comprising uniformly distributed third etching patterns; and performing etching along the third etching pattern, to remove the fourth barrier layer and etch the first mask to form the uniformly distributed etching holes.

10. The method of claim 9, wherein performing etching along the third etching pattern, to remove the fourth barrier layer and etch the first mask to form the uniformly distributed etching holes comprises:

etching the fourth barrier layer along the third etching pattern to form a second intermediate structure; and preforming etching by taking the second intermediate structure as a mask, to penetrate the first mask to form the uniformly distributed etching holes.

11. The method of claim 1, wherein performing etching along the first etching pattern, to remove the first barrier layer and etch the first dielectric layer to form the conductive channel comprises:

etching the first barrier layer along the first etching pattern to form a third intermediate structure; and etching the first dielectric layer by taking the third intermediate structure as a mask, to penetrate the first dielectric layer at a projection position of the etching hole to expose the active area, and etch part of the first dielectric layer at a projection position of the groove, thereby forming the conductive channel by etching the first dielectric layer.

12. The method of claim 1, wherein the etching hole is in a shape of circular;

a diameter of each etching hole is larger than a width of the groove extending in the first direction;

a projection of each etching hole covers at most one active area.

\* \* \* \* \*